United States Patent
Miyazaki et al.

(10) Patent No.: US 11,633,969 B2
(45) Date of Patent: Apr. 25, 2023

(54) DROPLET EJECTING APPARATUS AND DROPLET EJECTING METHOD IN WHICH RELATIVE POSITIONS OF WORKPIECE TABLE AND DROPLET EJECTING HEAD ARE CORRECTED

(71) Applicant: Tokyo Electron Limited, Tokyo (JP)

(72) Inventors: Kazuhito Miyazaki, Kumamoto (JP); Akira Kakino, Kumamoto (JP); Wataru Yoshitomi, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/911,539

(22) Filed: Mar. 5, 2018

(65) Prior Publication Data

US 2018/0261472 A1 Sep. 13, 2018

(30) Foreign Application Priority Data

Mar. 7, 2017 (JP) .............................. JP2017-042754

(51) Int. Cl.
*B41J 29/393* (2006.01)
*H01L 21/67* (2006.01)
(Continued)

(52) U.S. Cl.
CPC .......... *B41J 29/393* (2013.01); *B05B 12/084* (2013.01); *B05C 11/1005* (2013.01); *B05C 11/1015* (2013.01); *B05C 11/1034* (2013.01); *B41J 2/04505* (2013.01); *B41J 3/407* (2013.01); *B41J 11/42* (2013.01); *B41J 11/46* (2013.01); *B41J 25/001* (2013.01); *H01L 21/6715* (2013.01); *H01L 51/0005* (2013.01);
*H05B 33/10* (2013.01); *B05C 5/0216* (2013.01); *B29C 64/112* (2017.08); *B41J 2029/3935* (2013.01); *H01L 21/67259* (2013.01)

(58) Field of Classification Search
CPC ........ B41J 29/393; B41J 11/008; B41J 11/46; B41J 11/42; B05C 11/1015; B05C 11/1005; B05C 11/1034
USPC ...................................................... 347/14, 19
See application file for complete search history.

(56) References Cited

U.S. PATENT DOCUMENTS

2004/0252148 A1* 12/2004 Shibata .................. B41J 2/2139
347/14
2005/0177343 A1* 8/2005 Nagae ...................... H04R 9/06
702/183

(Continued)

FOREIGN PATENT DOCUMENTS

CN 1939731 A 4/2007
CN 101518995 A 9/2009
(Continued)

*Primary Examiner* — Karl Kurple
(74) *Attorney, Agent, or Firm* — Venjuris, P.C.

(57) ABSTRACT

A control unit obtains a captured image of a reference workpiece by a second image capturing unit after a droplet ejected from a droplet ejecting head lands toward a reference mark formed on an upper surface of the reference workpiece, detects a positional deviation amount of a position of the reference mark and a landing position of the droplet based on the captured image, and calculates the correction amounts of the relative positions of a workpiece table and a droplet ejecting head based on the positional deviation amount.

4 Claims, 10 Drawing Sheets

(51) Int. Cl.
*B05C 11/10* (2006.01)
*B41J 3/407* (2006.01)
*H05B 33/10* (2006.01)
*B41J 11/42* (2006.01)
*B05B 12/08* (2006.01)
*H01L 51/00* (2006.01)
*B41J 25/00* (2006.01)
*B41J 11/46* (2006.01)
*B41J 2/045* (2006.01)
*B05C 5/02* (2006.01)
*B29C 64/112* (2017.01)

(56) References Cited

U.S. PATENT DOCUMENTS

| | | | |
|---|---|---|---|
| 2005/0248602 A1* | 11/2005 | Newsome | B41J 25/001 347/19 |
| 2006/0054039 A1* | 3/2006 | Kritchman | B29C 48/92 101/424.1 |
| 2006/0216409 A1* | 9/2006 | Mishima | B41J 11/46 427/66 |
| 2007/0070107 A1* | 3/2007 | Shamoun | B41J 29/393 347/14 |
| 2008/0136853 A1* | 6/2008 | Kinoshita | B41J 2/04506 347/12 |
| 2012/0001972 A1* | 1/2012 | Nishioka | B41J 29/38 347/12 |
| 2014/0125728 A1* | 5/2014 | Ito | B41J 29/393 347/19 |
| 2018/0257101 A1* | 9/2018 | Miyazaki | B41J 11/0095 |

FOREIGN PATENT DOCUMENTS

| | | |
|---|---|---|
| JP | 2005-199172 A | 7/2005 |
| JP | 2010-198028 A | 9/2010 |
| KR | 10-2005-0075285 A | 7/2005 |

* cited by examiner

PULSE INSERTION

PULSE ELIMINATION

PULSE PITCH-
INCREASING
CONVERSION

PULSE PITCH-
DECREASING
CONVERSION

*FIG. 10*

| POSITION OF LINEAR MOTOR (mm) | POSITIONAL CORRECTION AMOUNT OF TABLE IN Y-AXIS DIRECTION (μm) | | | | |
|---|---|---|---|---|---|
| | L3 LINE BREAK -100mm | L5 LINE BREAK -50mm | L1 LINE BREAK 0mm | L4 LINE BREAK 10mm | L2 LINE BREAK 100mm |
| 0 | -2 | -1 | 0 | 0.2 | 2 |
| 100 | -4 | -2 | 0 | 0.4 | 4 |
| 200 | -6 | -3 | 0 | 0.6 | 6 |
| 300 | -8 | -4 | 0 | 0.8 | 8 |
| 400 | -10 | -5 | 0 | 1 | 10 |
| 500 | -12 | -6 | 0 | 1.2 | 12 |
| 600 | -14 | -7 | 0 | 1.4 | 14 |
| 700 | -16 | -8 | 0 | 1.6 | 16 |
| 800 | -18 | -9 | 0 | 1.8 | 18 |
| 900 | -20 | -10 | 0 | 2 | 20 |

DROPLET EJECTING APPARATUS AND DROPLET EJECTING METHOD IN WHICH RELATIVE POSITIONS OF WORKPIECE TABLE AND DROPLET EJECTING HEAD ARE CORRECTED

CROSS-REFERENCE TO RELATED APPLICATIONS

This application is based on and claims priority from Japanese Patent Application No. 2017-042754, filed on Mar. 7, 2017, with the Japan Patent Office, the disclosure of which is incorporated herein in its entirety by reference.

TECHNICAL FIELD

The present disclosure relates to a droplet ejecting apparatus which draws a pattern by ejecting functional liquid droplets onto a workpiece, a droplet ejecting method using the droplet ejecting apparatus, a program, and a computer storage medium.

BACKGROUND

In the related art, as an apparatus for drawing a pattern on a workpiece using a functional liquid, there has been known an inkjet type droplet ejecting apparatus which ejects the droplets of the functional liquid. The droplet ejecting apparatus is widely used, for example, when manufacturing electro-optical devices (flat panel displays (FPD)) such as organic EL devices, color filters, liquid crystal display devices, plasma displays (PDP devices), and electron emitting devices (field emission display (FED) devices or surface-conduction electron-emitter display (SED) devices).

For example, a droplet ejecting apparatus disclosed in Japanese Patent Application Laid-Open No. 2010-198028 includes a functional liquid droplet ejecting head (droplet ejecting head) which ejects the droplets of a functional liquid, a workpiece stage (workpiece table) on which a workpiece is mounted, and a movement mechanism (linear motor) which moves the workpiece table in a direction in which a pair of support bases for guidance extends (main scanning direction). Further, the droplet ejecting apparatus draws a pattern on the workpiece by ejecting the functional liquid from the droplet ejecting head into a bank formed in advance on the workpiece while moving the workpiece relative to the droplet ejecting head using the workpiece table.

In the droplet ejecting apparatus, workpiece alignment is performed in advance in order to eject the functional liquid accurately at a desired position on the workpiece. The workpiece table is configured to be rotatable and movable horizontally, and an image of an alignment mark of the workpiece is captured by an alignment camera provided above the workpiece table. Further, the workpiece alignment is performed by correcting the horizontal position of the workpiece table based on the captured image. Thereafter, the aligned workpiece is moved to a predetermined position, and the functional liquid is ejected into the bank on the workpiece from the droplet ejecting head.

During the drawing operation of the droplet ejecting apparatus, a first drawing operation (forward pass) is performed while the workpiece is moved in the main scanning direction (to the positive side in the Y-axis direction). Thereafter, the workpiece table is moved in a sub-scanning direction (X-axis direction) orthogonal to the main scanning direction, and then a second drawing operation (backward pass) is performed while the workpiece is moved in the main scanning direction (to the negative side in the Y-axis direction). Further, the workpiece table is moved in the sub-scanning direction (X-axis direction) again, and then a third drawing operation (forward pass) is performed while the workpiece is moved in the main scanning direction (to the positive side in the Y-axis direction). With this drawing operation, patterns are drawn on an overall surface of the workpiece.

In the following description, the operation of moving the workpiece table in the sub-scanning direction (X-axis direction) during the first to third drawing operations may be referred to as a "line break."

SUMMARY

The present invention provides a droplet ejecting apparatus that ejects droplets of a functional liquid to a workpiece so as to draw a pattern. The droplet ejecting apparatus includes: a workpiece table configured to place the workpiece thereon; a droplet ejecting head configured to eject the droplets onto the workpiece placed on the workpiece table; a movement mechanism configured to relatively move the workpiece table and the droplet ejecting head in a main scanning direction, a sub-scanning direction orthogonal to the main scanning direction, and a rotation direction; an image capturing unit provided at a downstream side of the droplet ejecting head in the main scanning direction and configured to obtain a captured image of the workpiece; and a control unit configured to calculate correction amounts of relative positions of the workpiece table and the droplet ejecting head and control the movement mechanism based on the correction amounts. The workpiece includes a reference workpiece used to calculate the correction amounts and having a plurality of reference marks formed on an upper surface thereof, and the control unit is configured to: obtain a captured image of the reference workpiece from the image capturing unit after the droplets ejected from the droplet ejecting head have landed toward the reference marks; detect a positional deviation amount between positions of the reference marks and landing positions of the droplets based on the captured image; and calculate the correction amounts based on the positional deviation amount.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 7A to 7C are explanatory views each illustrating, in a plan view, a state in which a drawing operation is performed on a reference workpiece, in which FIG. 7A illustrates a first drawing operation, FIG. 7B illustrates a second drawing operation, and FIG. 7C illustrates a third drawing operation.

FIGS. 8A to 8C are explanatory views each illustrating, in a side view, a state in which a drawing operation is performed on a reference workpiece, in which FIG. 8A illustrates the first drawing operation, FIG. 8B illustrates the second drawing operation, and FIG. 8C illustrates the third drawing operation.

FIGS. 9A to 9C are explanatory views each illustrating, in a plan view, a state in which a drawing operation is performed on a workpiece, in which FIG. 9A illustrates the first drawing operation, FIG. 9B illustrates the second drawing operation, and FIG. 9C illustrates the third drawing operation.

FIG. 10 is a view illustrating an example of a table illustrating interpolation of reference data.

DESCRIPTION OF EMBODIMENT

Figure 1:
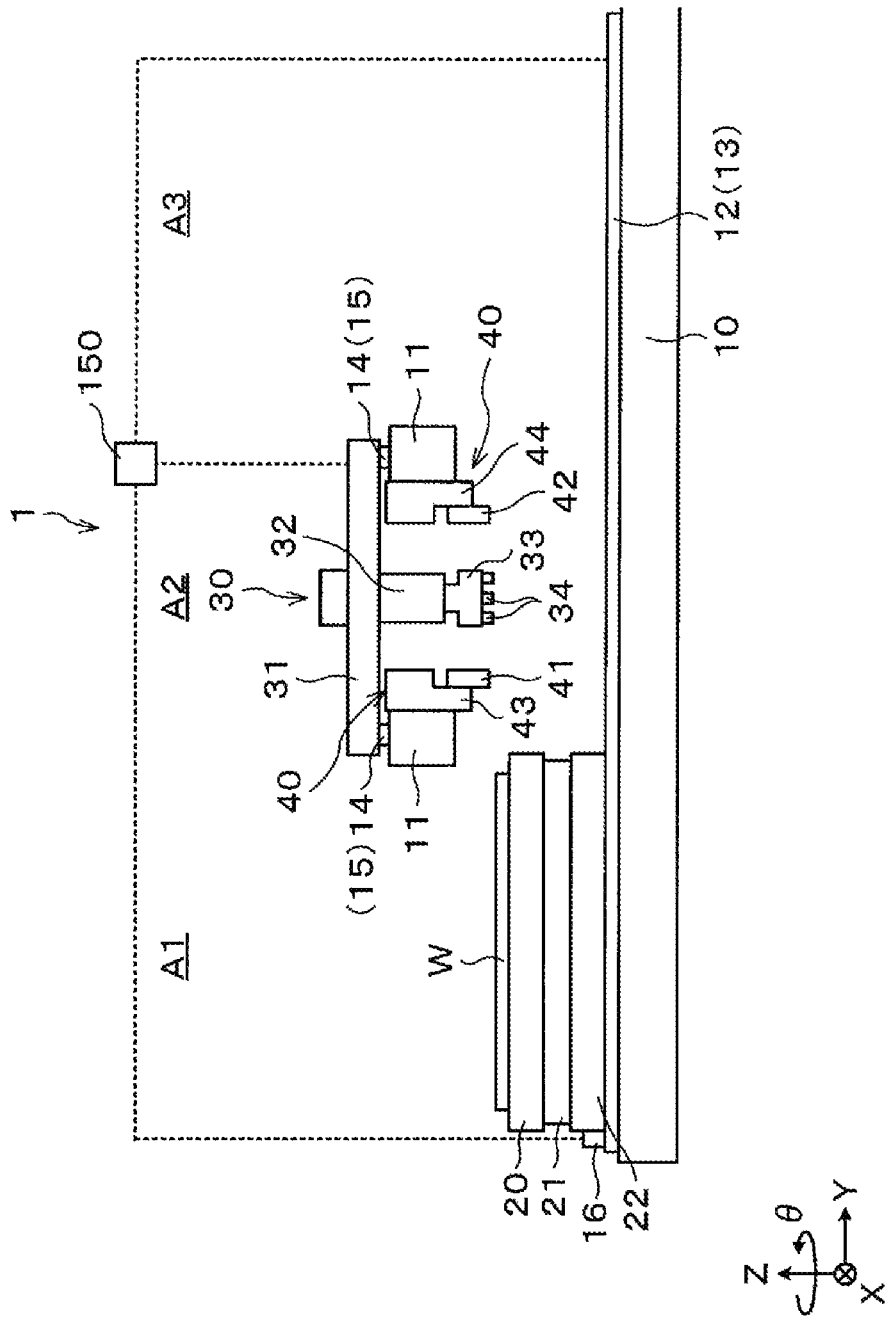
FIG. 1 is a side view illustrating an outline of a configuration of a droplet ejecting apparatus according to the present exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

During the process of moving the workpiece stage toward the functional liquid droplet ejecting head after the workpiece alignment is performed, a positional relationship between the functional liquid droplet ejecting head and the bank on the workpiece may be changed due to factors such as misalignment of a posture of the workpiece, a change in mechanical precision or linearity of a movement mechanism of the workpiece stage, a change in temperature, and a change with time.

When a line break is performed on the workpiece table, the positional relationship between the droplet ejecting head and the bank may be changed due to factors such as changes in posture, center of gravity, and linearity of the workpiece table. The change in posture, the change in center of gravity, and the change in linearity of the workpiece table may occur due to, for example, mechanical precision of the movement mechanism or non-flatness of a stage on which the workpiece table is moved at the time of performing a line break.

Recently, large and high-definition (e.g., 4K or 8K) products have become mainstream in the products such as televisions manufactured using droplet ejecting apparatuses, and the droplet ejecting apparatus are also enlarged as the sizes of the workpieces are enlarged. For this reason, the positional deviation between the droplet ejecting head and the bank due to the aforementioned factors, that is, the positional deviation which occurs while the droplets ejected from the droplet ejecting head land on the bank on the workpiece cannot be ignored. Furthermore, due to the influence of a pixel size, the tolerance range of the positional deviation is also decreased to, for example, ±2 μm or less.

Therefore, in a stage requiring precision control like the droplet ejecting apparatus, there is a demand for a technology of correcting the relative positions of the workpiece table and the droplet ejecting head in order to firmly cope with a change in environment. However, at present, such relative positions cannot be appropriately corrected in such a precision stage.

The present disclosure has been made in consideration of the aforementioned situations, and an object of the present disclosure is to improve landing precision of a droplet onto a workpiece from a droplet ejecting head by appropriately correcting the relative positions of a workpiece table and the droplet ejecting head, in a droplet ejecting apparatus that ejects the droplets of a functional liquid onto a workpiece so as to draw a pattern.

To achieve the aforementioned object, the present invention provides a droplet ejecting apparatus that ejects droplets of a functional liquid to a workpiece so as to draw a pattern. The droplet ejecting apparatus includes: a workpiece table configured to place the workpiece thereon; a droplet ejecting head configured to eject the droplets onto the workpiece placed on the workpiece table; a movement mechanism configured to relatively move the workpiece table and the droplet ejecting head in a main scanning direction, a sub-scanning direction orthogonal to the main scanning direction, and a rotation direction; an image capturing unit provided at a downstream side of the droplet ejecting head in the main scanning direction and configured to obtain a captured image of the workpiece; and a control unit configured to calculate correction amounts of relative positions of the workpiece table and the droplet ejecting head and control the movement mechanism based on the correction amounts. The workpiece includes a reference workpiece used to calculate the correction amounts and having a plurality of reference marks formed on an upper surface thereof, and the control unit is configured to: obtain a captured image of the reference workpiece from the image capturing unit after the droplets ejected from the droplet ejecting head have landed toward the reference marks; detect a positional deviation amount between positions of the reference marks and landing positions of the droplets based on the captured image; and calculate the correction amounts based on the positional deviation amount.

According to the present disclosure, it is possible to improve landing precision of the droplets on the workpiece from the droplet ejecting head by appropriately correcting the relative positions of the workpiece table and the droplet ejecting head even if positional deviation of the workpiece occurs due to factors such as a change in temperature or a change with time of each of the members of the droplet ejecting apparatus or positional deviation of the workpiece occurs when a line break is performed on the workpiece table.

Hereinafter, exemplary embodiments of the present disclosure will be described with reference to the accompanying drawings. Meanwhile, the present disclosure is not limited by the exemplary embodiments disclosed below.

<Configuration of Droplet Ejecting Apparatus>

Figure 2:
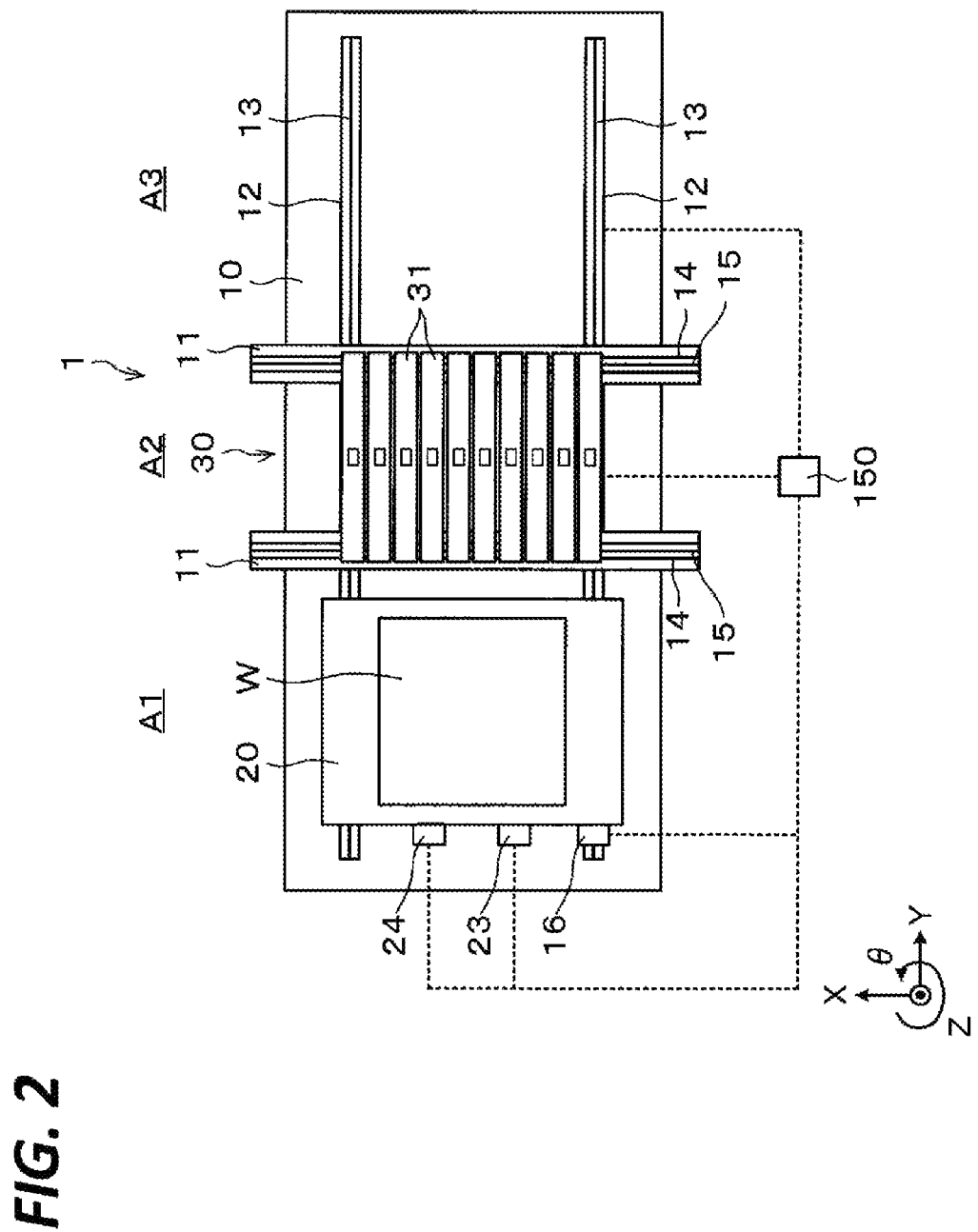
FIG. 2 is a top plan view illustrating an outline of the configuration of the droplet ejecting apparatus according to the present exemplary embodiment.

First, a configuration of a droplet ejecting apparatus according to the present exemplary embodiment will be described with reference to FIGS. 1 and 2. FIG. 1 is a side view illustrating an outline of a configuration of a droplet ejecting apparatus 1. FIG. 2 is a top plan view illustrating an outline of the configuration of the droplet ejecting apparatus 1. Further, hereinafter, a main scanning direction of a workpiece W is defined as a Y-axis direction, a sub-scanning direction orthogonal to the main scanning direction is defined as an X-axis direction, a vertical direction orthogonal to the Y-axis direction and the X-axis direction is defined as a Z-axis direction, and a rotation direction about the Z-axis is defined as a θ direction.

The droplet ejecting apparatus 1 has a Y-axis stage 10 extending in the main scanning direction (Y-axis direction) and moving the workpiece W in the main scanning direction, and a pair of X-axis stages 11 and 11 crossing over the Y-axis stage 10 and extending in the sub-scanning direction (X-axis direction). A pair of Y-axis guide rails 12 and 12 is provided to extend in the Y-axis direction on the upper surface of the Y-axis stage 10, and Y-axis linear motors 13 and 13 are provided on the Y-axis guide rails 12 and 12, respectively. X-axis guide rails 14 and 14 are provided to extend in the X-axis direction on upper surfaces of the X-axis stages 11 and 11, respectively, and X-axis linear motors 15 and 15 are provided on the X-axis guide rails 14 and 14, respectively. Further, in the following description, on the Y-axis stage 10, a negative side area with respect to the X-axis stage 11 in the Y-axis direction is defined as a loading and unloading area A1, an area between the pair of X-axis stages 11 and 11 is defined as a processing area A2, and a negative side area with respect to the X-axis stage 11 in the Y-axis direction is defined as a standby area A3.

A Y-axis linear scale 16 is provided on the Y-axis linear motor 13 so as to measure the position of the Y-axis linear motor 13. An encoder pulse (pulse signal), which indicates the position of the Y-axis linear motor 13, is output from the Y-axis linear scale 16. Further, the position of the Y-axis linear motor 13 means a position of a movable element of the Y-axis linear motor 13.

A workpiece table 20 is provided on the Y-axis stage 10. A carriage unit 30 and an image capturing unit 40 are provided on the pair of X-axis stages 11 and 11.

The workpiece table 20 is, for example, a vacuum suction table, and is configured to mount thereon the workpiece W by holding the workpiece W by suction. The workpiece table 20 is supported by a table movement mechanism 21 provided at a lower side of the workpiece table 20 so that the workpiece table 20 is movable in the X-axis direction and rotatable in the θ direction. The workpiece table 20 and the table movement mechanism 21 are supported on a Y-axis slider 22 provided on the lower side of the table movement mechanism 21. The Y-axis slider 22 is mounted on the Y-axis guide rails 12 and configured to be movable in the Y-axis direction by the Y-axis linear motors 13. Therefore, the workpiece table 20 is moved by the Y-axis slider 22 in the Y-axis direction along the Y-axis guide rails 12 and 12 in a state in which the workpiece W is placed on the workpiece table 20 such that the workpiece W may be moved in the Y-axis direction. Further, in the present exemplary embodiment, the table movement mechanism 21 is configured to move the workpiece table 20 in the X-axis direction and rotate the workpiece table 20 in the θ direction. However, a mechanism for moving the workpiece table 20 in the X-axis direction and a mechanism for rotating the workpiece table 20 in the θ direction may be separately provided.

The table movement mechanism 21 is provided with an X-axis linear scale 23 configured to measure the position of the table movement mechanism 21 in the X-axis direction, and a rotary encoder 24 configured to measure the position of the table movement mechanism 21 in the θ direction. Encoder pulses (pulse signals), which respectively indicate the position of the table movement mechanism 21 (workpiece table 20) in the X-axis direction and the position of the table movement mechanism 21 (workpiece table 20) in the θ direction, are output from the X-axis linear scale 23 and the rotary encoder 24, respectively.

A workpiece alignment camera (not illustrated) is provided above the workpiece table 20 in the loading and unloading area A1 to capture an image of the workpiece W placed on the workpiece table 20. Further, based on the image captured by the workpiece alignment camera, the position in the Y-axis direction, the position in the X-axis direction, and the position in the θ direction of the workpiece W placed on the workpiece table 20 are corrected by the Y-axis slider 22 and the table movement mechanism 21, as necessary. Therefore, the workpiece W is aligned such that a predetermined initial position of the workpiece W is set.

A plurality of (e.g., ten) carriage units 30 are provided on the X-axis stages 11. Each of the carriage units 30 has a carriage plate 31, a carriage holding mechanism 32, a carriage 33, and droplet ejecting heads 34. The carriage holding mechanism 32 is provided at the center of the lower side of the carriage plate 31, and the carriage 33 is detachably mounted on the lower end of the carriage holding mechanism 32.

The carriage plate 31 is mounted on the X-axis guide rails 14 and 14 and may be moved by the X-axis linear motors 15 and 15 in the X-axis direction. Further, a plurality of carriage plates 31 may be integrally moved in the X-axis direction.

A motor (not illustrated) is mounted on the carriage 33. The carriage 33 is configured to be movable in the X-axis direction and the θ direction by the motor. In the present exemplary embodiment, the Y-axis linear motor 13, the table movement mechanism 21, and the carriage 33 constitute the movement mechanisms of the present disclosure. Further, the movements of the carriage 33 in the X-axis direction and the θ direction may be performed by, for example, the carriage holding mechanism 32.

The multiple droplet ejecting heads 34 are arranged side by side in the Y-axis direction and the X-axis direction on the lower side of the carriage 33. In the present exemplary embodiment, for example, the six droplet ejecting heads 34 are provided in the Y-axis direction, and the two droplet ejecting heads 34 are provided in the X-axis direction. That is, a total of twelve droplet ejecting heads 34 are provided. A plurality of ejecting nozzles (not illustrated) are disposed on the lower surface of the droplet ejecting head 34, that is, a nozzle surface. Further, the droplets of a functional liquid are ejected from the ejecting nozzles to droplet ejecting positions directly under the droplet ejecting head 34.

The image capturing unit 40 has a first image capturing unit 41 and a second image capturing unit 42 which are provided to face each other in the Y-axis direction with the carriage 33 (droplet ejecting head 34) interposed therebetween. For example, CCD cameras may be used as the first image capturing unit 41 and the second image capturing unit 42, and the first image capturing unit 41 and the second image capturing unit 42 may capture images of the workpiece W placed on the workpiece table 20 regardless whether the workpiece table 20 is being moved, stopped, or subjected to a workpiece processing (droplet ejecting). The first image capturing unit 41 is disposed on the negative side in the Y-axis direction with respect to the carriage 33, and the second image capturing unit 42 is disposed on the positive side in the Y-axis direction with respect to the carriage 33. Further, the image capturing unit 40 may be configured to be movable in the X-axis direction.

The first image capturing unit 41 is supported on a base 43 provided on the negative side X-axis stage 11 in the Y-axis direction, among the pair of X-axis stages 11 and 11. Further, when the workpiece table 20 is guided to a position directly under the first image capturing unit 41, the first image capturing unit 41 captures an image of the workpiece W placed on the workpiece table 20 at a predetermined cycle.

The second image capturing unit 42 is supported on a base 44 provided on the positive side X-axis stage 11 in the Y-axis direction, among the pair of X-axis stages 11 and 11. Further, when the workpiece table 20 is guided to a position directly under the second image capturing unit 42, the second image capturing unit 42 captures an image of the workpiece W placed on the workpiece table 20, thereby capturing an image of the droplets, which have landed on an upper surface of the workpiece W. The obtained captured image is input to a correction amount calculator 160 of a control unit 150 to be described below.

<Control Unit>

The droplet ejecting apparatus 1 described above is provided with a control unit 150. The control unit 150 is, for example, a computer and has a data storage unit (not illustrated). For example, the data storage unit stores drawing data (bitmap data) or the like for drawing a predetermined pattern on the workpiece W by controlling the droplets ejected onto the workpiece W. In addition, the control unit 150 has a program storage unit (not illustrated). The program storage unit stores a program for controlling various types of processings in the droplet ejecting apparatus 1.

The data or the program may be recorded in, for example, a computer-readable storage medium such as, for example, a computer-readable hard disk (HD), a flexible disk (PD), a compact disk (CD), a magneto-optical disk (MO), and a memory card, and may be installed in the control unit 150 from the storage medium.

Figure 3:
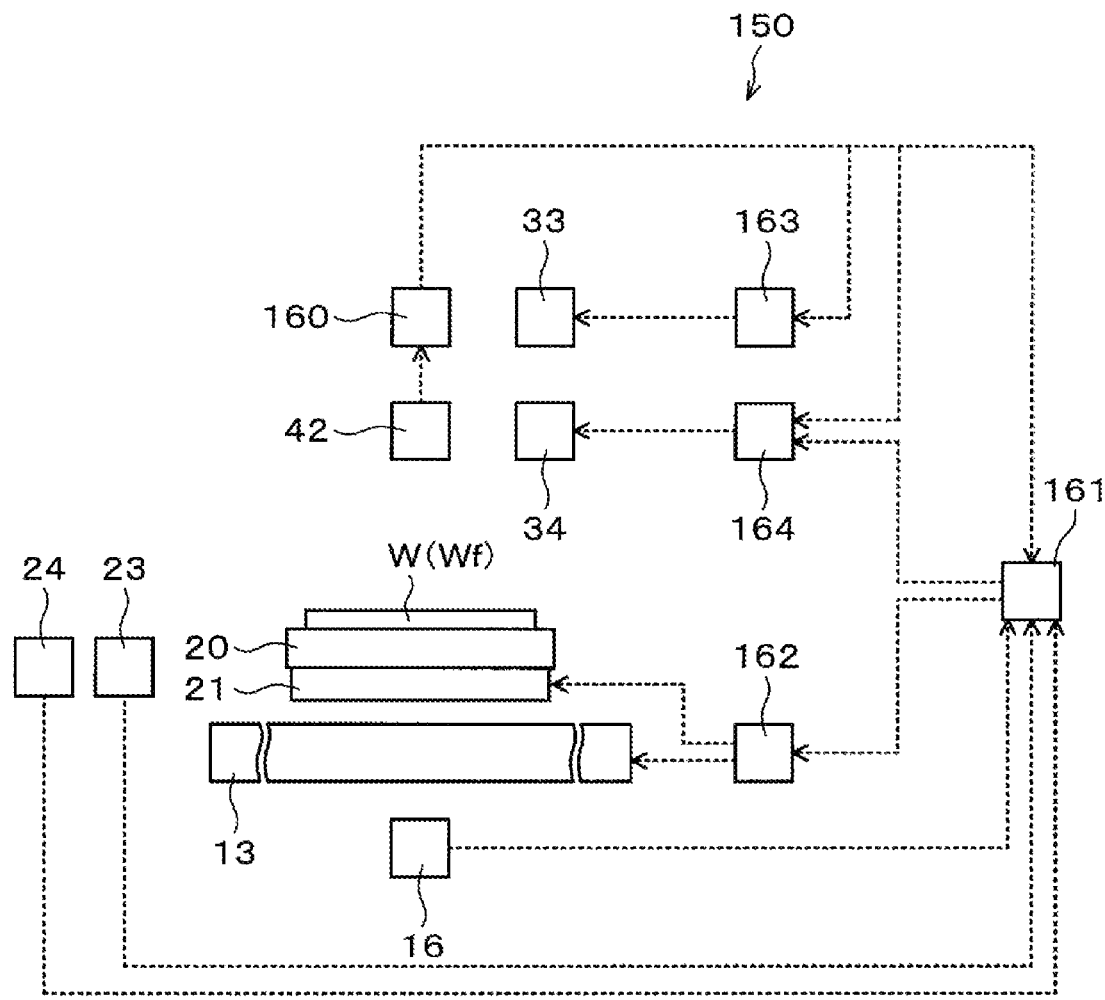
FIG. 3 is an explanatory view schematically illustrating an outline of a configuration of a control unit.

As illustrated in FIG. 3, the control unit 150 has a correction amount calculator 160 configured to calculate various types of correction amounts based on the captured image by processing the captured image obtained by the second image capturing unit 42, a corrector 161 configured to correct the position of the workpiece table 20 (the positions of the Y-axis linear motor 13 and the table movement mechanism 21), a first motion controller 162 (motion driver) configured to control movements of the Y-axis linear motor 13 and the table movement mechanism 21, a second motion controller 163 configured to control a movement of the carriage 33, and an inkjet controller 164 configured to control an ejecting timing of the droplet ejecting head 34.

(Correction Amount Calculator)

Figure 4:
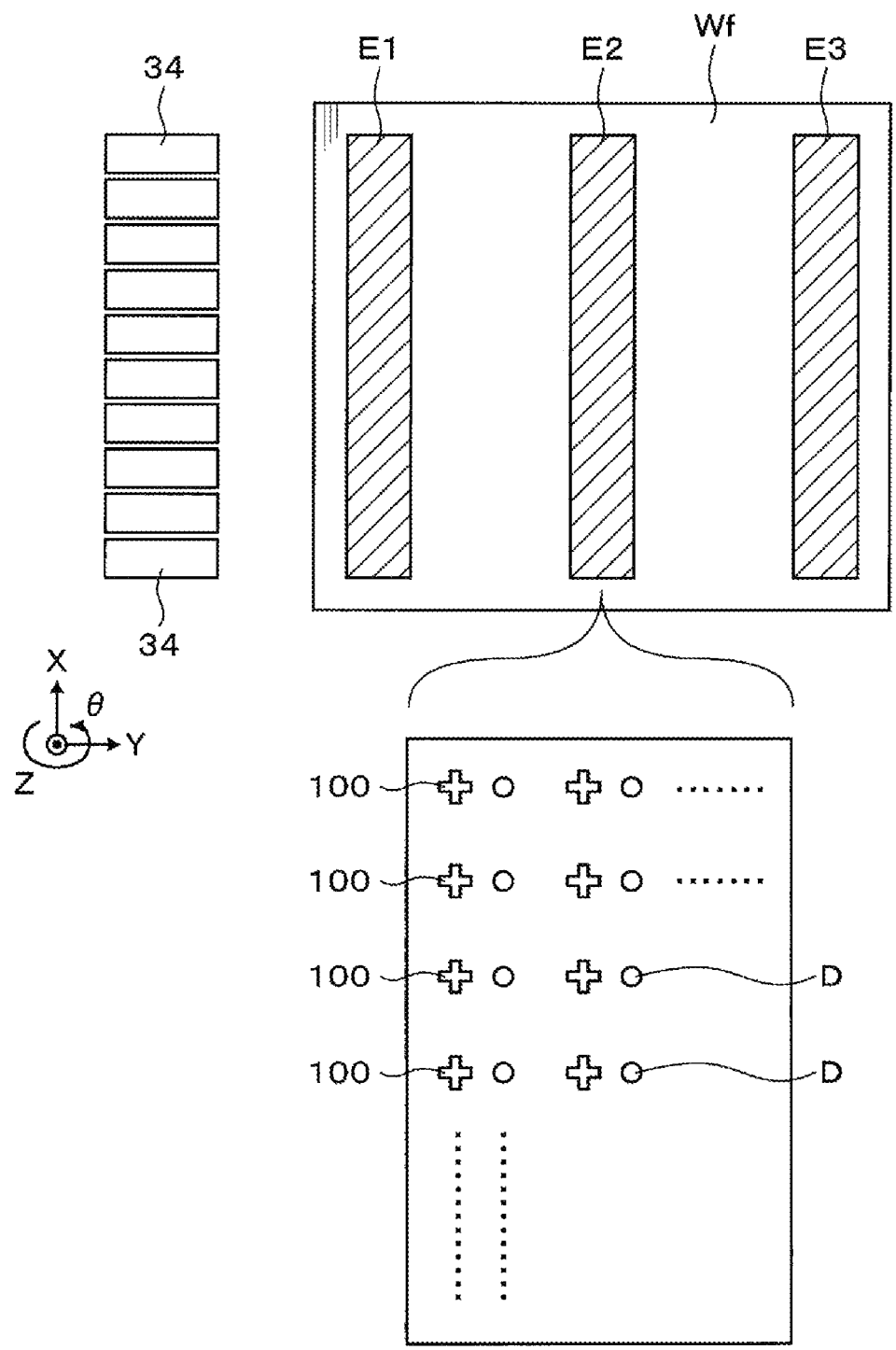
FIG. 4 is an explanatory view illustrating an outline of a configuration of a reference workpiece.

Based on a captured image obtained by the second image capturing unit 42, the correction amount calculator 160 calculates the correction amounts of the relative positions of the workpiece table 20 and the droplet ejecting head 34 and a correction amount of the droplet ejecting timing of the droplet ejecting head 34. Further, instead of the workpiece W for a product for mass-production, a reference workpiece Wf illustrated in FIG. 4 is used to calculate the correction amount.

Here, a configuration of the reference workpiece Wf will be described. Landing regions E1 to E3 are formed on the upper surface of the reference workpiece Wf such that droplets land from the droplet ejecting head 34 land thereon. The first landing region E1 is formed on the negative side in the Y-axis direction, the second landing region E2 is formed at a center in the Y-axis direction, and the third landing region E3 is formed on the positive side in the Y-axis direction.

The number of landing regions E is not limited by the present exemplary embodiment, but two or more landing regions E are required. As will be described below, based on a positional deviation amount of the droplets in the landing regions E, the correction amount calculator 160 calculates the correction amounts of the relative positions of the workpiece table 20 and the droplet ejecting head 34 and a correction amount of the droplet ejecting timing of the droplet ejecting head 34. That is, two or more landing regions E are required because positional information of the reference workpiece Wf at least in the Y-axis direction, the X-axis direction, and the θ direction is required. Therefore, three landing regions E1 to E3 are formed on the upper surface of the reference workpiece Wf of the present exemplary embodiment. Further, the number of landing regions E may be two, and of course, the droplets may be caused to land on the entire surface of the reference workpiece Wf.

Figure 5:
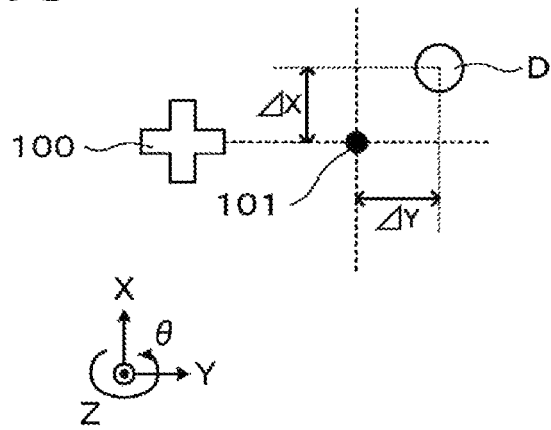
FIG. 5 is an explanatory view illustrating a positional relationship between a reference mark, a target, and a droplet.

A plurality of reference marks 100 are formed each of the respective landing regions E1 to E3. The reference marks 100 are arranged side by side at a predetermined pitch in the X-axis direction and are arranged in a plurality of rows in the Y-axis direction. In addition, as illustrated in FIG. 5, a target 101, which is a landing target position of a droplet D from the droplet ejecting head 34, is set in the vicinity of each of the reference marks 100. Here, when the droplet D is ejected toward the reference mark 100 from the droplet ejecting head 34, it is difficult to distinguish the reference mark 100 and the droplet D when the image of the workpiece W is captured by the second image capturing unit 42 because the reference mark 100 and the droplet D overlap each other. Therefore, the target 101 of the droplet D is slightly spaced apart from the reference mark 100. Meanwhile, it is assumed that a distance between the reference mark 100 and the target 101 is very small in the present exemplary embodiment, and a position of the reference mark 100 is approximately equal to a position of the target 101 in the present disclosure.

Reference marks 100 are marked on the upper surface of the workpiece W using, for example, an inkjet type marking method. Further, in FIGS. 4 and 5, substantially cross-shaped marks are marked as the reference marks 100, but the shape of the reference marks 100 is not limited by the contents of the present exemplary embodiment. The shape of the reference marks 100 may be, for example, circular or triangular, and may be arbitrary set as long as the marks can be identified.

Based on the captured image illustrated in FIG. 5, the correction amount calculator 160 detects a position of a target 101 on the reference workpiece Wf, and a positional deviation amount of the droplet D, which has landed on the reference workpiece Wf. As the positional deviation amount, $\Delta Y$ is detected as a Y-axis component, and $\Delta X$ is detected as an X-axis component.

Based on the positional deviation amounts $\Delta Y$ and $\Delta X$, the correction amount calculator 160 calculates the correction amounts of the relative positions of the workpiece table 20 and the droplet ejecting head 34 and the correction amount of the droplet ejecting timing of the droplet ejecting head 34. Specifically, the correction amounts are calculated through the following four steps Q1 to Q4.

First, based on the positional deviation amounts $\Delta Y$ and $\Delta X$, a positional correction amount of the workpiece table 20 in the θ direction and a positional correction amount of the workpiece table 20 in the X-axis direction are calculated (step Q1). The calculated correction amounts are output to the corrector 161. Further, in the following description, the correction amounts calculated in step Q1 are referred to as a "table posture correction amount."

Next, in a state in which the table posture correction amount in step Q1 is applied to the workpiece table 20, a positional correction amount of the droplet ejecting head 34 in the θ direction and a positional correction amount of the droplet ejecting head 34 in the X-axis direction are calculated based on the positional deviation amounts $\Delta Y$ and $\Delta X$ (step Q2). The calculated correction amounts are output to the second motion controller 163. Further, in the following description, the correction amounts calculated in step Q2 are referred to as a "head position correction amount."

Next, in a state in which the head position correction amount in step Q2 is applied to the droplet ejecting head 34, a positional correction amount of the workpiece table 20 in the Y-axis direction is calculated based on the positional deviation amounts ΔY and ΔX (step Q3). The calculated correction amounts are output to the corrector 161. Further, in the following description, the correction amount calculated in step Q3 is referred to as a "table Y-axis position correction amount."

Finally, in a state in which the table Y-axis position correction amount in step Q3 is applied to the workpiece table 20, the ejecting timing of the droplet D from the droplet ejecting head 34 is corrected based on the positional deviation amounts ΔY and ΔX (step Q4). The calculated correction amount is output to the inkjet controller 164. Further, in the following description, the correction amount calculated in step Q4 is referred to as an "ejecting timing correction amount."

(Corrector)

Based on the correction amounts from the correction amount calculator 160, the corrector 161 converts a pulse signal from the Y-axis linear scale 16 into an actual position of the Y-axis linear motor 13. In addition, based on the correction amounts from the correction amount calculator 160, the corrector 161 converts a pulse signal from the X-axis linear scale 23 and a pulse signal from the rotary encoder 24 into an actual posture of the workpiece table 20. Specifically, the following steps S1 to S3 are performed.

First, the corrector 161 recognizes the current position of the Y-axis linear motor 13 by receiving and counting the pulse signal from the Y-axis linear scale 16. In addition, a shape (pulse shape) of the pulse signal from the Y-axis linear scale 16 is analyzed in order to convert the pulse signal in the following step S3 (step S1). In step S1, the corrector 161 also receives the pulse signal from the X-axis linear scale 23 and the pulse signal from the rotary encoder 24.

Next, the corrector 161 receives the table posture correction amount (positional correction amounts of the workpiece table 20 in the θ direction and the X-axis direction) and the table Y-axis position correction amount (positional correction amount of the workpiece table 20 in the Y-axis direction) from the correction amount calculator 160 (step S2).

Figure 6A:
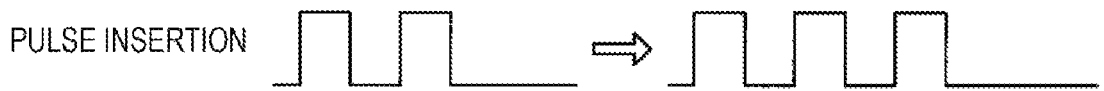
FIGS. 6A to 6D are explanatory views each illustrating a state in which a pulse signal is converted by a corrector.
Figure 6B:
Figure 6C:
Figure 6D:

Next, based on the pulse shape analyzed in step S1 and the table Y-axis position correction amount received in step S2, the corrector 161 converts the pulse signal received from the Y-axis linear scale 16 into an actual position of the Y-axis linear motor 13. FIGS. 6A to 6D illustrate states of converting the pulse signals, in which the left view illustrates the pulse signals received from the Y-axis linear scale 16, and the right view illustrates the pulse signals output to the first motion controller 162 after conversion. For example, the number of pulses is changed by inserting the pulse as illustrated in FIG. 6A and eliminating the pulse as illustrated in FIG. 6B, or a pulse pitch is changed by increasing the pulse pitch as illustrated in FIG. 6C and decreasing the pulse pitch as illustrated in FIG. 6D. Further, the pulse signal of which the number of pulses and the pulse pitch are changed is output to the first motion controller 162 (step S3).

The pulse signal, which is converted in step S3 as described above, is also output to the inkjet controller 164. The inkjet controller 164 controls the droplet ejecting timing of the droplet ejecting head 34, and the droplet ejecting timing is set based on the position of the Y-axis linear motor 13. In the present exemplary embodiment, the pulse signal output from the corrector 161 is output to the inkjet controller 164, and as a result, it is possible to eject the droplet from the droplet ejecting head 34 at an appropriate timing.

In step S3, based on the table posture correction amount received in step S2, the corrector 161 converts each of the pulse signal from the X-axis linear scale 23 and the pulse signal from the rotary encoder 24 into an actual posture of the workpiece table 20. The converted pulse signal is output to the first motion controller 162.

In a case in which the Y-axis linear motor 13 is moved at a high speed, the corrector 161 needs to perform high-speed processing so as to calculate the correction amount in real time. For this reason, the corrector 161 may be implemented to have functions of an application specific integrated circuit (ASIC) and a field programmable gate array (FPGA).

(First Motion Controller)

Based on the table Y-axis position correction amount received from the corrector 161 and the pulse signal generated by converting the pulse signal from the Y-axis linear scale 16, the first motion controller 162 controls the movement of the Y-axis linear motor 13 (workpiece table 20) by outputting a command signal (pulse train) to the Y-axis linear motor 13. In addition, based on the table posture correction amount received from the corrector 161 and the pulse signals generated by converting the pulse signal from the X-axis linear scale 23 and the pulse signal from the rotary encoder 24, the first motion controller 162 controls the movement of the table movement mechanism 21 by outputting a command signal (pulse train) to the table movement mechanism 21. Further, the positions of the workpiece table 20 in the Y-axis direction, the X-axis direction, and the θ direction are corrected. Further, the first motion controller 162 receives the pulse signals related to the Y axis, the X axis, and the θ, thereby configuring fully closed control.

(Second Motion Controller)

Based on the head position correction amount from the correction amount calculator 160, the second motion controller 163 controls the movements of the carriage 33 in the X-axis direction and the θ direction. Further, the positions of the droplet ejecting head 34 in the θ direction and the X-axis direction are corrected.

(Inkjet Controller)

Based on the pulse signal (pulse signal after conversion) in the Y-axis direction which is received from the corrector 161, the inkjet controller 164 controls the droplet ejecting timing of the droplet ejecting head 34 by outputting a command signal (pulse train) to the droplet ejecting head 34. In addition, based on the ejecting timing correction amount from the correction amount calculator 160, the inkjet controller 164 controls the droplet ejecting timing of the droplet ejecting head 34.

<Processing on Workpiece in Droplet Ejecting Apparatus>

Next, a processing on the workpiece performed using the droplet ejecting apparatus 1 configured as described above will be described. In the present exemplary embodiment, prior to performing a typical processing on the workpiece W for a product, a predetermined processing is performed on the reference workpiece Wf in order to calculate the table posture correction amount, the head position correction amount, the table Y-axis position correction amount, and the ejecting timing correction amount.

(Processing on Reference Workpiece)

First, a predetermined processing is performed on the reference workpiece Wf. The workpiece table 20 is disposed in the loading and unloading area A1, and the reference workpiece Wf, which is loaded into the droplet ejecting apparatus 1 by a transport mechanism (not illustrated), is placed on the workpiece table 20. Next, an image of the reference workpiece Wf placed on the workpiece table 20 is captured by the workpiece alignment camera. Further, based on the captured image, the positions of the reference workpiece Wf, which is placed on the workpiece table 20, in the X-axis direction and the θ direction are corrected by the table movement mechanism 21 such that the alignment of the reference workpiece Wf is performed (step T1).

Thereafter, the workpiece table 20 is reciprocated in the Y-axis direction by the Y-axis linear motor 13 and moved (performs a line break) in the X-axis direction such that patterns are drawn in the landing regions E1 to E3 of the reference workpiece Wf. In the present exemplary embodiment, a case in which a line break is performed twice in the X-axis direction, that is, the workpiece table 20 moves along three scanning lines extending in the Y-axis direction (main scanning direction) will be described. In addition, in the present exemplary embodiment, as illustrated in FIG. 7, a case in which the two droplet ejecting heads 34 are used among the multiple droplet ejecting heads 34 will be described. Further, information about the droplet ejecting head 34 in this case, information about the landing position of the droplet in the landing regions E1 to E3 that is ejected from the droplet ejecting head 34, information about the line break of the workpiece table 20, and information about a reciprocation trajectory are registered in advance, and the drawing operation is performed in accordance with the information.

Figure 7A:
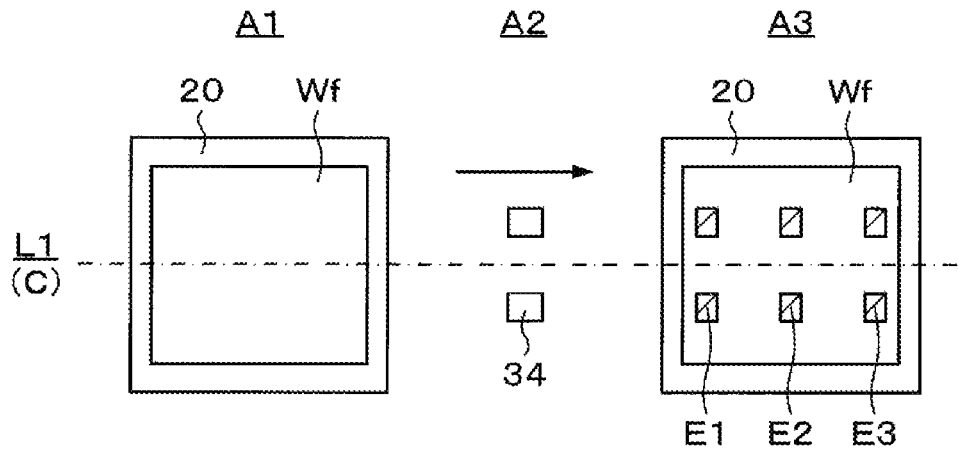
Figure 8A:
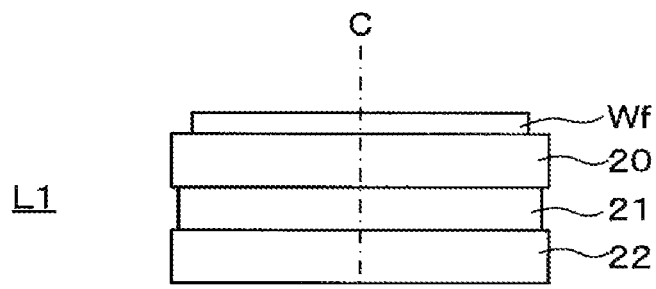

First, as illustrated in FIGS. 7A and 8A, the first drawing operation (forward pass) is performed while the workpiece table 20 is moved from the loading and unloading area A1 to the standby area A3 (to the positive side in the Y-axis direction) along a first scanning line L1 by the Y-axis linear motor 13. The first scanning line L1 is a line passing through a centerline C of the workpiece table 20 in the X-axis direction. In this case, in the processing area A2, the droplets are ejected from the droplet ejecting head 34 onto the reference workpiece Wf which is moved to a position under the droplet ejecting head 34. Then, a pattern is drawn at a position of the reference workpiece Wf which corresponds to the droplet ejecting head 34 (step T2). Specifically, in the respective landing regions E1 to E3, the droplets are ejected from the droplet ejecting head 34 toward the targets 101 positioned in the vicinity of the reference marks 100. Further, a pattern is drawn in the landing regions E1 to E3 along the first scanning line L1.

Figure 7B:
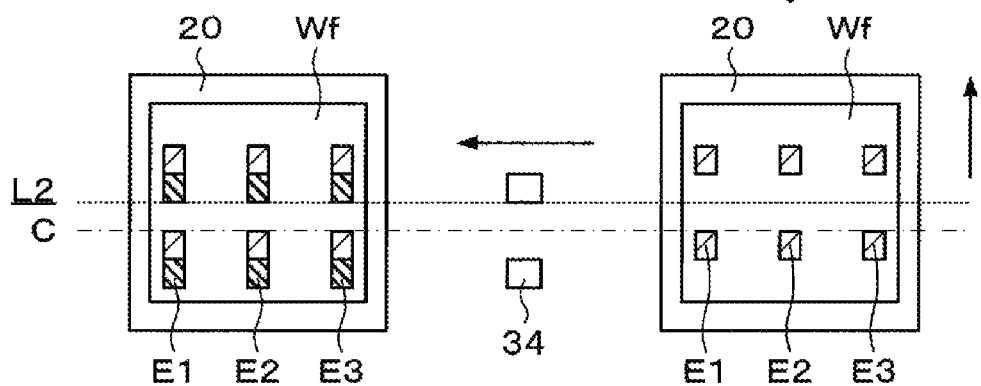
Figure 8B:
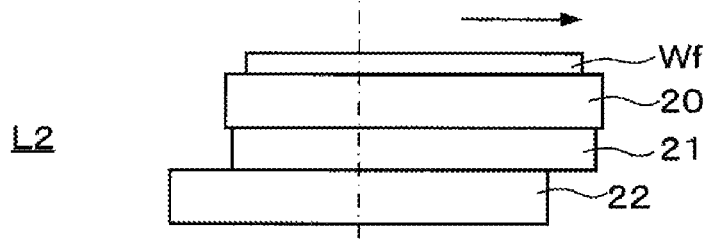

Next, as illustrated in FIGS. 7B and 8B, the workpiece table 20 is moved (performs a line break) by the table movement mechanism 21 to the positive side in the X-axis direction by one carriage. Next, the second drawing operation (backward pass) is performed while the workpiece table 20 is moved from the standby area A3 to the loading and unloading area A1 (to the negative side in the Y-axis direction) along a second scanning line L2 by the Y-axis linear motor 13. That is, the second scanning line L2 is a line passing through the positive side in the X-axis direction with respect to the centerline C of the workpiece table 20 in the X-axis direction. In this case, in the processing area A2, the droplet is ejected from the droplet ejecting head 34 onto the reference workpiece Wf which is moved to a position under the droplet ejecting head 34. Then, a pattern is drawn at a position of the reference workpiece Wf which corresponds to the droplet ejecting head 34 (step T3). Specifically, in the respective landing regions E1 to E3, the droplet is ejected from the droplet ejecting head 34 toward the target 101 positioned in the vicinity of the reference mark 100. Further, a pattern is drawn in the landing regions E1 to E3 along the second scanning line L2.

Figure 7C:
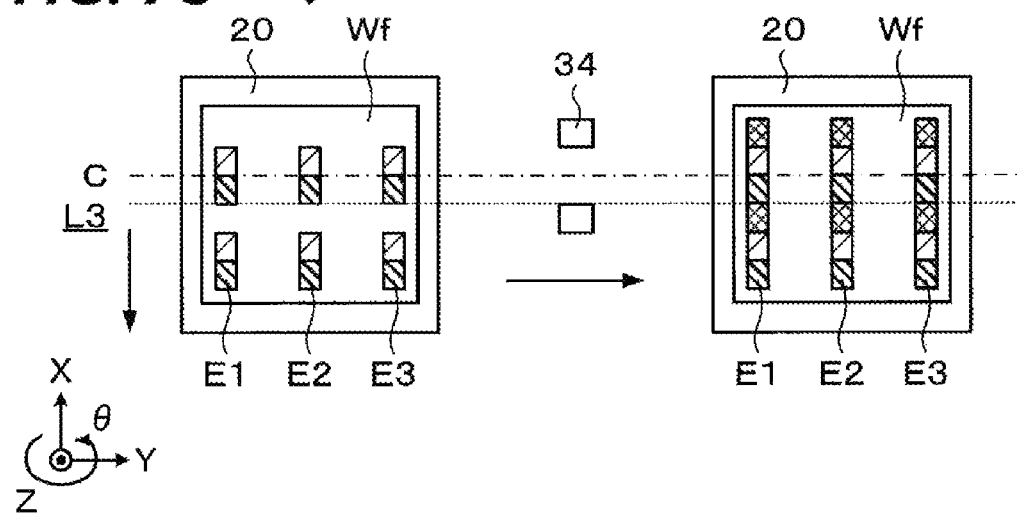
Figure 8C:
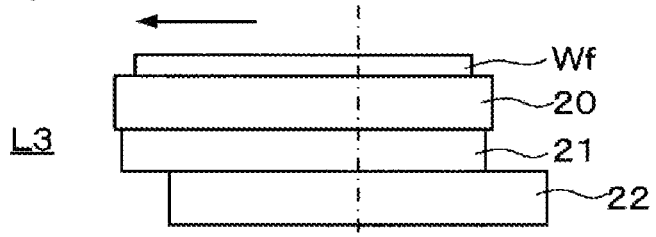
Figure 8C:
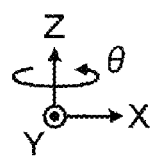

Next, as illustrated in FIGS. 7C and 8C, the workpiece table 20 is moved (performs a line break) by the table movement mechanism 21 to the negative side in the X-axis direction by two carriages. Next, the third drawing operation (forward pass) is performed while the workpiece table 20 is moved from the loading and unloading area A1 to the standby area A3 (to the positive side in the Y-axis direction) along a third scanning line L3 by the Y-axis linear motor 13. That is, the third scanning line L3 is a line passing through the negative side in the X-axis direction with respect to the centerline C of the workpiece table 20 in the X-axis direction. In this case, in the processing area A2, droplets are ejected from the droplet ejecting head 34 onto the reference workpiece Wf which is moved to a position under the droplet ejecting head 34. Then, a pattern is drawn at a position of the reference workpiece Wf which corresponds to the droplet ejecting head 34 (step T4). Specifically, in each of the landing regions E1 to E3, the droplets are ejected from the droplet ejecting head 34 toward the targets 101 positioned in the vicinity of the reference marks 100. Further, a pattern is drawn in the landing regions E1 to E3 along the third scanning line L3.

In step T4, the second image capturing unit 42 captures an image of a droplet, which has landed on the upper surface of the reference workpiece Wf, by capturing an image of the entire surface of the reference workpiece Wf. The obtained captured image is input to the correction amount calculator 160. The correction amount calculator 160 calculates the table posture correction amount, the head position correction amount, the table Y-axis position correction amount, and the ejecting timing correction amount for each of the first to third scanning lines L1 to L3 by performing the aforementioned steps Q1 to Q4. Hereinafter, the four correction amounts for the first scanning line L1 are referred to as "first correction amounts," the four correction amounts for the second scanning line L2 are referred to as "second correction amounts," and the four correction amounts for the third scanning line L3 are referred to as "third correction amounts."

Accordingly, the patterns are drawn in the landing regions E1 to E3 by the drawing operations in steps T2 to T4, and the first to third correction amounts are calculated for the first to third scanning lines L1 to L3.

After the third drawing operation, the workpiece table 20 positioned in the standby area A3 is moved to the loading and unloading area A1, and the reference workpiece Wf is unloaded from the droplet ejecting apparatus 1. In this case, in the processing area A2, no droplet is ejected onto the reference workpiece Wf from the droplet ejecting head 34.

(Processing on Workpiece for Product)

Next, a predetermined processing is performed on the workpiece W for a product. First, in the processing on the workpiece W, the alignment of the workpiece W is performed in the loading and unloading area A1 by correcting the positions of the workpiece W placed on the workpiece table 20 in the X-axis direction and the θ direction (step T5). Step T5 is the same as the aforementioned step T1.

Figure 9A:
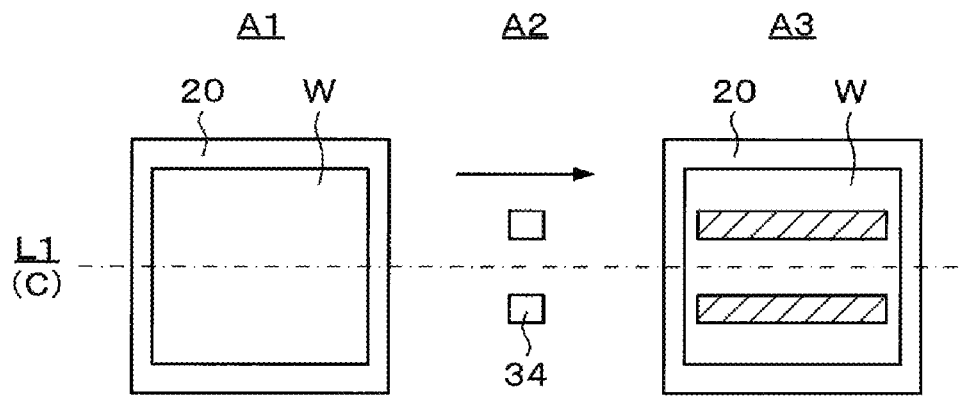

Thereafter, as illustrated in FIG. 9A, the first drawing operation is performed while the workpiece table 20 is moved from the loading and unloading area A1 to the standby area A3 along the first scanning line L1. Further, a pattern is drawn at a position corresponding to the droplet ejecting head 34 in the workpiece W (step T6).

In step T6, the position of the Y-axis linear motor 13 is measured by the Y-axis linear scale 16 while the workpiece table 20 is moved in the Y-axis direction. The pulse signal from the Y-axis linear scale 16 is output to the corrector 161. In addition, the positions of the table movement mechanism 21 in the X-axis direction and the θ direction are also measured by the X-axis linear scale 23 and the rotary encoder 24, respectively, and the pulse signal from the X-axis linear scale 23 and the pulse signal from the rotary encoder 24 are also output to the corrector 161.

The corrector 161 performs the aforementioned steps S1 to S3 using the pulse signal from the Y-axis linear scale 16 and the first correction amount calculated in step T4. Further, the pulse signal, which is converted based on the first correction amount (first table Y-axis position correction amount), is output to the first motion controller 162 and the inkjet controller 164 from the corrector 161. In addition, the pulse signal, which is converted based on the first correction amount (first table posture correction amount), is also output to the first motion controller 162 from the corrector 161.

Based on the pulse signal (pulse signal after conversion) in the Y-axis direction which is received from the corrector 161, the first motion controller 162 corrects the position of the Y-axis linear motor 13 by outputting a command signal (pulse train) to the Y-axis linear motor 13. For example, in a case in which a target position is 1,000 mm and the target position deviates by +1 μm (extension side), a pulse of a position of 1,000 mm is output to the first motion controller 162 when a pulse of a position of 999.999 mm is received.

Based on the pulse signals (pulse signals after conversion) in the X-axis direction and the θ direction which are received from the corrector 161, the first motion controller 162 controls the movement of the table movement mechanism 21 by outputting a command signal (pulse train) to the table movement mechanism 21. Further, the posture of the workpiece table 20 is corrected.

In step T6, based on the first correction amount (first head position correction amount) calculated in step T4, the second motion controller 163 controls the movement of the carriage 33. Further, the positions of the droplet ejecting head 34 in the θ direction and the X-axis direction are corrected.

In step T6, based on the pulse signal received from the corrector 161, the inkjet controller 164 controls the droplet ejecting timing of the droplet ejecting head 34 by outputting a command signal (pulse train) to the droplet ejecting head 34. In addition, based on the first correction amount (first ejecting timing correction amount) calculated in step T4, the inkjet controller 164 controls the droplet ejecting timing of the droplet ejecting head 34. Further, the droplet ejecting timing of the droplet ejecting head 34 is corrected.

Figure 9B:
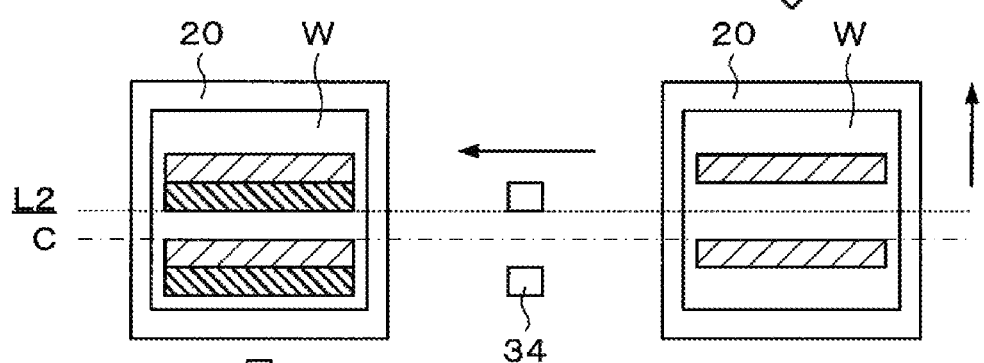

Next, as illustrated in FIG. 9B, the workpiece table 20 is moved (performs a line break) to the positive side in the X-axis direction by an extent of one carriage, and then the second drawing operation is performed while the workpiece table 20 is moved from the standby area A3 to the loading and unloading area A1 along the second scanning line L2. Further, a pattern is drawn at a position corresponding to the droplet ejecting head 34 in the workpiece W which (step T7).

In step T7, as in step T6, the positions of the workpiece table 20 in the Y-axis direction, the X-axis direction, and the θ direction, the positions of the droplet ejecting head 34 in the X-axis direction and the θ direction, and the droplet ejecting timing of the droplet ejecting head 34 are corrected using the second correction amount calculated in step T4.

Figure 9C:
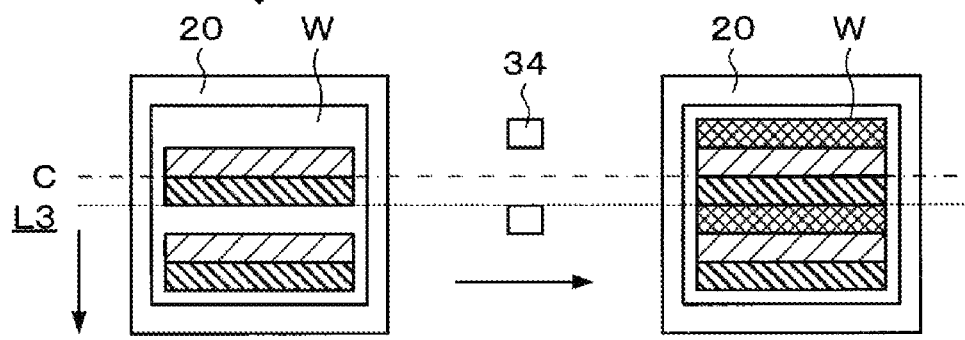
Figure 9C:
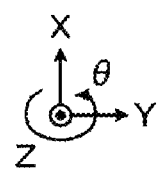

Next, as illustrated in FIG. 9C, the workpiece table 20 is moved (performs a line break) to the negative side in the X-axis direction by an extent of two carriages, and then the third drawing operation is performed while the workpiece table 20 is moved from the loading and unloading area A1 to the standby area A3 along the third scanning line L3. Further, a pattern is drawn at a position corresponding to the droplet ejecting head 34 in the workpiece W (step T8).

In step T8, as in step T6, the positions of the workpiece table 20 in the Y-axis direction, the X-axis direction, and the θ direction, the positions of the droplet ejecting head 34 in the X-axis direction and the θ direction, and the droplet ejecting timing of the droplet ejecting head 34 are corrected by using the third correction amount calculated in step T4.

Therefore, the patterns are drawn on the entire surface of the workpiece by the drawing operations in steps T6 to T8.

When the workpiece table 20 is moved to the loading and unloading area A1, the workpiece W on which the drawing processing is completed is unloaded from the droplet ejecting apparatus 1. Next, a next workpiece W is loaded into the droplet ejecting apparatus 1. Next, the alignment of the workpiece W is performed in the aforementioned step T5, and then steps T6 to T8 are performed.

Steps T5 to T8 are performed on each workpiece as described above, and then a series of processing are terminated on the workpieces ends.

According to the exemplary embodiment, even though positional deviation of the workpiece W occurs due to factors such as a change in temperature or a change with time of each of the members of the droplet ejecting apparatus 1, it is possible to appropriately correct the relative positions of the workpiece table 20 and the droplet ejecting head 34 based on the calculated first to third correction amounts. For this reason, it is possible to align the droplet ejecting head and the workpiece with high precision. In addition, it is also possible to appropriately correct the droplet ejecting timing of the droplet ejecting head 34 based on the first to third correction amounts. Therefore, it is possible to improve ejecting precision (landing precision) of the droplets from the droplet ejecting head 34 to the workpiece W.

The first to third correction amounts are obtained for the first to third scanning lines L1 to L3, respectively. That is, the correction amount is calculated for the entire surface of the workpiece W. For this reason, even if the positional deviation of the workpiece W occurs while a line break is performed on the workpiece table 20, it is possible to appropriately correct the relative positions of the workpiece table 20 and the droplet ejecting head 34, and also appropriately correct the droplet ejecting timing of the droplet ejecting head 34 using the first to third correction amounts. Therefore, it is possible to further improve ejecting precision (landing precision) of the droplets from the droplet ejecting head 34 to the workpiece W.

Here, for example, only the first correction amount may be calculated, and the first correction amount may be used for the second scanning line L2 and the third scanning line L3. However, in this case, the first correction amount may not be appropriate to the second and third scanning lines L2 and L3 which are line-fed, and as a result, there is concern that an ejecting position of a droplet from the droplet ejecting head 34 to the workpiece W deviates. In this respect, the first to third correction amounts are used for respective scanning lines L1 to L3 as in the present exemplary embodiment, and as a result, it is possible to more appropriately correct the relative positions of the workpiece table 20 and the droplet ejecting head 34.

Another Exemplary Embodiment

Next, another exemplary embodiment of the present disclosure will be described.

In the aforementioned exemplary embodiment, after patterns are drawn in the landing regions E1 to E3 along the first to third scanning lines L1 to L3 by performing steps T2 to T4, and then, in step T4, the first to third correction amounts are respectively calculated for the first to third scanning lines L1 to L3 based on the image of the reference workpiece Wf captured by the second image capturing unit 42. In this respect, in each of steps T2 to T4, the first to third correction amounts may be calculated.

In this case, in step T2, a pattern is drawn in the landing regions E1 to E3 along the first scanning line L1 by performing the first drawing operation (forward pass), and then the second image capturing unit 42 captures an image of the droplets landed on the upper surface of the reference workpiece Wf by capturing an image of the reference workpiece Wf. The obtained captured image is input to the correction amount calculator 160. The correction amount calculator 160 calculates the table posture correction amount, the head position correction amount, the table Y-axis position correction amount, and the ejecting timing correction amount, that is, the first correction amounts by performing the aforementioned steps Q1 to Q4.

In step T3, a pattern is drawn in the landing regions E1 to E3 along the second scanning line L2 by performing the second drawing operation (backward pass), and then the first image capturing unit 41 captures an image of the droplet landed on the upper surface of the reference workpiece Wf by capturing an image of the reference workpiece Wf. The obtained captured image is input to the correction amount calculator 160. The correction amount calculator 160 calculates the table posture correction amount, the head position correction amount, the table Y-axis position correction amount, and the ejecting timing correction amount, that is, the second correction amounts by performing the aforementioned steps Q1 to Q4.

In step T4, a pattern is drawn in the landing regions E1 to E3 along the third scanning line L3 by performing the third drawing operation (forward pass), and then the second image capturing unit 42 captures an image of the droplet landed on the upper surface of the reference workpiece Wf by capturing an image of the reference workpiece Wf. The obtained captured image is input to the correction amount calculator 160. The correction amount calculator 160 calculates the table posture correction amount, the head position correction amount, the table Y-axis position correction amount, and the ejecting timing correction amount, that is, the third correction amounts by performing the aforementioned steps Q1 to Q4.

Even in the present exemplary embodiment, it is possible to obtain an effect similar to the effects of the aforementioned exemplary embodiment. That is, it is possible to improve ejecting precision (landing precision) of the droplets from the droplet ejecting head 34 to the workpiece W by appropriately correcting the relative positions of the workpiece table 20 and the droplet ejecting head 34 based on the first to third correction amounts.

In the aforementioned exemplary embodiments, a configuration in which the patterns are drawn on the entire surface of the workpiece W (reference workpiece Wf) while the workpiece table 20 is moved along three scanning lines L1 to L3 has been described, but the number of scanning lines is not limited thereto.

In the aforementioned exemplary embodiments, the first to third correction amounts are calculated for each of the scanning lines L1 to L3, but the correction amounts may be obtained for some of the scanning lines, and the correction amounts may be interpolated such that the correction amounts may be calculated for the other scanning lines.

A case, in which, when patterns are drawn on the entire surface of the reference workpiece Wf while the workpiece table 20 is moved along five scanning lines L1 to L5, for example, as illustrated in FIG. 10, for example, first to third correction amounts are respectively calculated for the first to third scanning lines L1 to L3 and correction amounts are not calculated for the fourth and fifth scanning lines L4 and L5, will be described, as an example. Further, the first to third correction amounts are obtained by performing the aforementioned steps T2 to T4. In addition, in the following description, the first to third correction amounts may be referred to as "reference data."

In FIG. 10, the first scanning line L1 (line break of 0 mm) is the centerline C of the workpiece table 20 in the X-axis direction, the second scanning line L2 (line break of 100 mm) and the fourth scanning line L4 line break of 10 mm) are scanning lines spaced apart from the centerline C to the positive side in the X-axis direction, and the third scanning line L3 (line break of −100 mm) and the fifth scanning line L5 (line break −50 mm) are scanning lines spaced apart from the centerline C to the negative side in the X-axis direction. In addition, FIG. 10 illustrates an example of the positional correction amount of the workpiece table 20 in the Y-axis direction, but in addition to the positional correction amount of the workpiece table 20 in the Y-axis direction, the table posture correction amount, the head position correction amount, and the ejecting timing correction amount are calculated.

A fourth correction amount for the fourth scanning line L4 is calculated by performing two-dimensional interpolation on the first correction amount and the second correction amount. In addition, a fifth correction amount for the fifth scanning line L5 is calculated by performing two-dimensional interpolation on the first correction amount and the third correction amount. Further, an interpolation method of obtaining the fourth correction amount and the fifth correction amount is not limited to the two-dimensional interpolation. For example, multidimensional interpolation may be applied.

Here, since a plurality of patterns related to line breaks are present, it is complicated and difficult to perform steps T2 to T4 for all of the scanning lines. In the present exemplary embodiment, it is possible to calculate the correction amounts by obtaining the reference data by performing steps T2 to T4 for some scanning lines L1 to L3 and interpolating the reference data for the other scanning lines L4 and L5. Therefore, it is possible to calculate the correction amounts for the entire surface of the workpiece W without performing the complicated operation.

Figure 11:
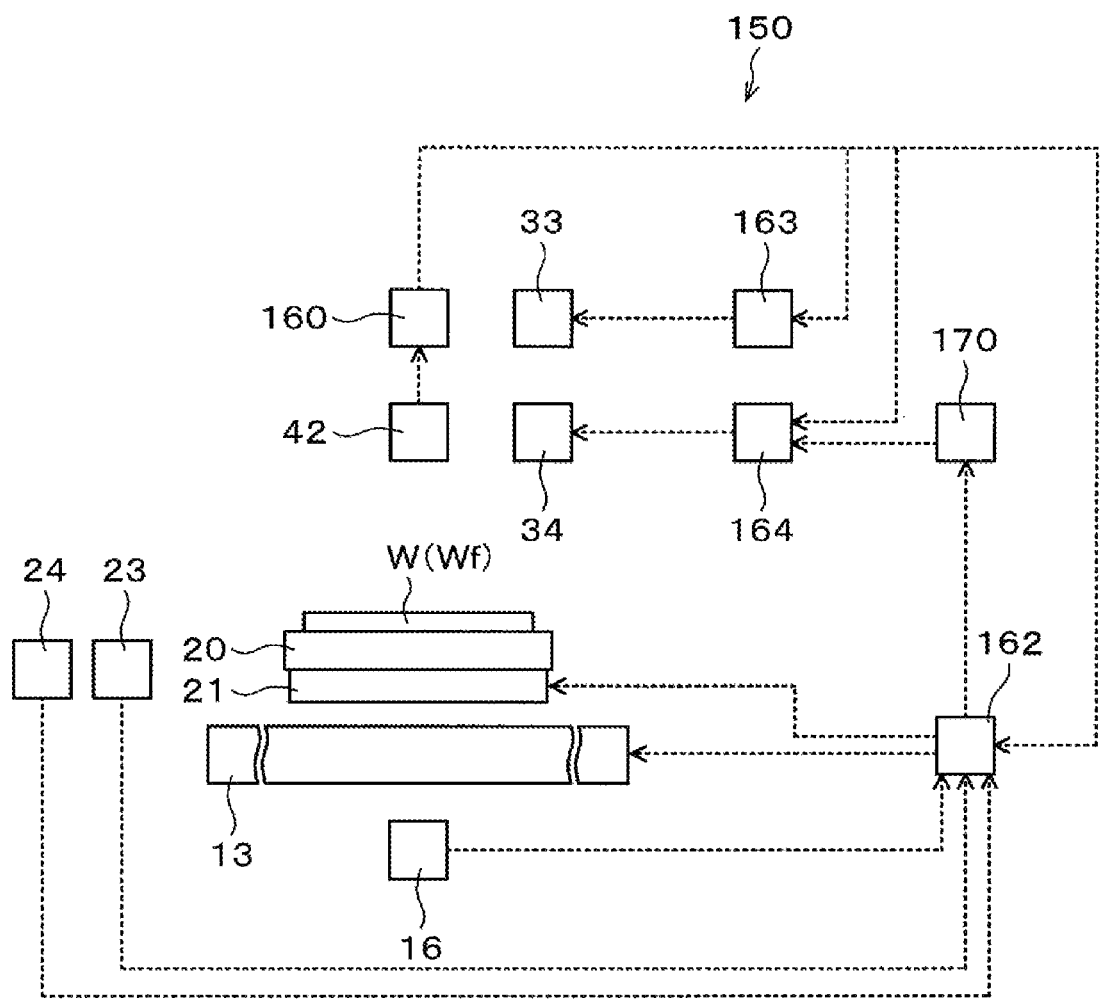
FIG. 11 is an explanatory view schematically illustrating an outline of a configuration of a control unit according to another exemplary embodiment.

In the aforementioned exemplary embodiments, the control unit 150 is configured to use the corrector 161 as illustrated in FIG. 3, but the control unit 150 is not limited thereto. For example, as illustrated in FIG. 11, in addition to the correction amount calculator 160, the first motion controller 162, the second motion controller 163, and the inkjet controller 164, the control unit 150 has an encoder inverter 170 which inverts a pulse signal from the second motion controller 163. Further, the corrector 161 is omitted from the control unit 150 in the present exemplary embodiment.

In this case, the first motion controller 162 performs the aforementioned steps S1 to S3. That is, the pulse signal received from the Y-axis linear scale 16 is converted based on the pulse signal from the Y-axis linear scale 16 and the table Y-axis position correction amount from the correction amount calculator 160. In addition, the pulse signal received from the X-axis linear scale 23 and the pulse signal received from the rotary encoder 24 are converted based on the pulse signal from the X-axis linear scale 23, the pulse signal from the rotary encoder 24, and the table posture correction amount from the correction amount calculator 160.

Based on the aforementioned pulse signal (pulse signal after conversion) in the Y-axis direction, the first motion controller 162 corrects the position of the Y-axis linear motor 13 by outputting a command signal (pulse train) to the Y-axis linear motor 13. For example, in a case in which a target position is 1,000 mm and the target position deviates by +1 μm (extension side), a command is applied to the Y-axis linear motor 13 so that the Y-axis linear motor 13 is moved by 999.999 mm and the position is corrected so that an actual position is 1,000 mm.

Based on the aforementioned pulse signals (pulse signals after conversion) in the X-axis direction and the θ direction, the first motion controller 162 also controls the movement of the table movement mechanism 21 by outputting a command signal (pulse train) to the table movement mechanism 21.

Meanwhile, the pulse signal in the Y-axis direction converted by the first motion controller 162 is also output to the encoder inverter 170. The encoder inverter 170 inverts the pulse signal from the first motion controller 162 using an inversion table and outputs the inverted pulse signal to the inkjet controller 164. That is, the pulse signal from the first motion controller 162 corrects the position of the Y-axis linear motor 13, but the pulse signal is inverted into the pulse signal from the Y-axis linear scale 16.

Here, even though the position of the Y-axis linear motor 13 is corrected to a position of 999.999 mm, the ejecting timing of the droplet ejecting head 34 is still the target position of 1,000 mm. Therefore, in the encoder inverter 170, the pulse signal from the first motion controller 162, which indicates 999.999 mm, is inverted into the pulse signal which indicates 1,000 mm. Further, the pulse signal, which indicates 1,000 mm, is output from the encoder inverter 170 to the inkjet controller 164, and the droplet ejecting timing of the droplet ejecting head 34 is controlled.

Based on the ejecting timing correction amount from the correction amount calculator 160, the inkjet controller 164 controls the droplet ejecting timing of the droplet ejecting head 34.

Based on the head position correction amount from the correction amount calculator 160, the second motion controller 163 controls the movement of the carriage 33.

Therefore, it is possible to appropriately correct the droplet ejecting timing of the droplet ejecting head 34 by appropriately correcting the relative positions of the workpiece table 20 and the droplet ejecting head 34. Further, even in the present exemplary embodiment, it is possible to obtain an effect which is the same as the effects of the aforementioned exemplary embodiment.

In the aforementioned exemplary embodiments, the workpiece table 20 is moved in the Y-axis direction, but the droplet ejecting head 34 may be moved in the Y-axis direction. In addition, both of the workpiece table 20 and the droplet ejecting head 34 may be moved in the Y-axis direction. In any case, the correction amount calculator 160 calculates the table posture correction amount, the head position correction amount, the table Y-axis position correction amount, and the ejecting timing correction amount by performing the aforementioned steps Q1 to Q4.

In the aforementioned exemplary embodiments, a line break is performed by moving the workpiece table 20. However, the droplet ejecting head 34 may be moved in the X-axis direction. When the droplet ejecting head 34 is moved in the X-axis direction, the X-axis linear motor 15 may be used.

<Application Example of Droplet Ejecting Apparatus>

The droplet ejecting apparatus 1 configured as described above is applied to, for example, a substrate processing system for forming an organic EL layer of an organic light emitting diode disclosed in Japanese Patent Application Laid-Open No. 2017-13011. Specifically, the droplet ejecting apparatus 1 is applied to a coating apparatus for applying an organic material for forming a hole injection layer on a glass substrate as the workpiece W, a coating apparatus for applying an organic material for forming a hole transport layer on a glass substrate (hole injection layer), and a coating apparatus for applying an organic material for forming a light emitting layer on a glass substrate (hole transport layer). Further, in a case in which the substrate processing system also forms an electron transport layer and an electron injection layer in addition to forming the hole injection layer, the hole transport layer, and the light emitting layer of the organic light emitting diode, the droplet ejecting apparatus 1 may also be applied to the coating process of forming the electron transport layer and the electron injection layer.

The droplet ejecting apparatus 1 may be applied to forming the organic EL layer of the organic light emitting diode as described above, and may be applied to manufacturing electro-optical devices (flat panel displays (FPD)) such as color filters, liquid crystal display devices, plasma displays (PDP devices), and electron emitting devices (FED devices or SED devices), or may be applied to forming metal wiring, lenses, resist, light diffusion bodies, and the like.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A droplet ejecting apparatus comprising:
 a workpiece table configured to mount a workpiece thereon;
 a droplet ejecting head configured to eject droplets of a functional liquid onto the workpiece mounted on the workpiece table;
 a table mover configured to move the workpiece table and the droplet ejecting head relative to each other in a main scanning direction and a sub-scanning direction orthogonal to the main scanning direction;
 a camera provided at a downstream side of the droplet ejecting head in the main scanning direction and configured to obtain a captured image of the workpiece;
 a reference workpiece including a first landing region and a third landing region with a second landing region positioned therebetween, the second landing region extending along a center of the workpiece, the first, second, and third landing regions extending in the sub-scanning direction and being arranged side by side in the main scanning direction, each landing region including a plurality of reference marks formed on an upper surface of the reference workpiece and a target set in the vicinity of each of the plurality of reference marks on the upper surface of the reference workpiece; and a computer configured to control operations of the droplet ejecting apparatus, the computer being configured to:
  perform a first drawing operation by moving, by the table mover, the workpiece table along a first scanning line from among a plurality of scanning lines which extend in the main scanning direction and are set side by side in the sub-scanning direction and ejecting the droplets from the droplet ejecting head toward corresponding targets of each of the plurality of landing regions so as to draw a pattern along the first scanning line in each of the first, second, and third landing regions, respectively, on the reference workpiece;
  move, by the table mover, the workpiece table in the sub-scanning direction after performing the first drawing operation;
  perform a second drawing operation by moving, by the table mover, the workpiece table along a second scanning line from among the plurality of scanning lines, in a direction opposite to the main scanning direction and ejecting the droplets from the droplet ejecting head toward corresponding targets of each of the plurality of landing regions so as to draw a pattern along the second scanning line in each of the first, second, and third landing regions, respectively, on the reference workpiece, after moving the workpiece table in the sub-scanning direction;
  move, by the table mover, the workpiece table in a direction opposite to the subscanning direction, after performing the second drawing operation;
  perform a third drawing operation by moving, by the table mover, the workpiece table along a third scanning line from among the plurality of scanning lines and ejecting the droplets from the droplet ejecting head toward corresponding targets of each of the plurality of landing regions so as to draw a pattern along the third scanning line in each of the first, second, and third landing regions, respectively, on the reference workpiece, after moving the workpiece table in the direction opposite to the sub-scanning direction;
  capture an image of the patterns formed on the reference workpiece using the camera after the droplets, ejected from the droplet ejecting head from the first drawing operation, the second drawing operation, and the third drawing operation which were directed toward each of the first, second, and third landing regions, have landed on the reference workpiece;
  detect positional deviation amounts between positions of each of the targets of the reference workpiece and actual landing positions of the droplets on the reference workpiece based on the image which has been captured;
  calculate a first correction amount of the workpiece table in the main scanning direction for the first scanning line based on the positional deviation amounts which have been detected;
  calculate a second correction amount of the workpiece table in the main scanning direction for the second scanning line based on the positional deviation amounts which have been detected;
  calculate a third correction amount of the workpiece table in the main scanning direction for the third scanning line based on the positional deviation amounts which have been detected;
  calculate a fourth correction amount of the workpiece table in the main scanning direction for a fourth scanning line positioned between the first scanning line and the second scanning line by interpolating the first correction amount and the second correction amount;
  calculate a fifth correction amount of the workpiece table in the main scanning direction for a fifth scanning line positioned between the first scanning line and the third scanning line by interpolating the first correction amount and the third correction amount; and
  correct the relative positions of the workpiece table and the droplet ejecting head based on the first through fifth correction amounts which have been calculated, for subsequent drawing operations along the first through fifth scanning lines on a workpiece for a product.

2. The droplet ejecting apparatus of claim 1, wherein the computer is further configured to:
  calculate a positional correction amount of the workpiece table in a rotation direction and in the sub-scanning direction; and
  calculate a positional correction amount of the droplet ejecting head in the rotation direction and in the sub-scanning direction.

3. A droplet ejecting method comprising:
  providing a droplet ejecting apparatus including:
    a workpiece table configured to mount a workpiece thereon;
    a droplet ejecting head configured to eject droplets of a functional liquid onto the workpiece mounted on the workpiece table;
    a table mover configured to move the workpiece table and the droplet ejecting head in a main scanning direction and a sub-scanning direction orthogonal to the main scanning direction;
    a camera provided at a downstream side of the droplet ejecting head in the main scanning direction and configured to obtain a captured image of the workpiece;
    a reference workpiece including a first landing region and a third landing region with a second landing region positioned therebetween, the second landing region extending along a center of the workpiece, the first, second, and third landing regions extending in the sub-scanning direction and being arranged side by side in the main scanning direction, each landing region including a plurality of reference marks formed on an upper surface of the workpiece and a target set in the vicinity of each of the plurality of reference marks on the upper surface of the reference workpiece; and
  a computer configured to control operations of the droplet ejecting apparatus, the computer being confirgured to:
    perform a first drawing operaion by moving, by the table mover, the workpiece tabel along a first scanning line from among a plurality of scanning lines which extend in the main scanning direction and are set side by side in the sub-scanning direction and ejecting the droplets from the droplet ejecting head toward corresponding targets of each of the plurality of landing regions so as to draw a pattern along the first scanning line in each of the first, second, and third landing regions, respectively, on the reference workpiece;
    move, by the table mover, the workpiece table in the sub-scanning direction after performing the first drawing operation;

perfrom a second drawing operation by moving, by the table mover, the workpiece table along a second scanning line from among the plurality of scanning lines, in a direction opposite to the main scanning direction and ejecting the droplets from the droplet ejecting head toward corresponding targets of each of the plurality of landing regions so as to draw a pattern along the second scanning line in each of the first, second, and third landing regions, respectively, on the reference workpiece, after moving the workpiece table in the sub-scanning direction;

move, by the table mover, the workpiece table in a direction opposite to the sub-scanning direction, after performing the second drawing operation;

perform a third drawing operation by moving, by the table mover, the workpiece table along a third scanning line from among the plurality of scanning lines and ejecting the droplets from the droplet ejecting head toward corresponding targets of each of the plurality of landing regions so as to draw a pattern along the third scanning line in each of the first, second, and third landing regions, respectively, on the reference workpiece, after moving the workpiece table in the direction opposite to the sub-scanning direction;

capture an image of the patterns formed on the reference workpiece using the camera after the droplets, ejected from the droplet ejecting head from the first drawing operation, the seocnd drawing operation, and the third drawing operation which were directed toward each of the first, second, and third landing regions, have landed on the reference workpiece;

detect positional deviation amounts between positions of each of the targets of the reference workpiece and actual landing positions of the droplets on the reference workpiece based on the image which has been captured;

calculate a first correction amount of the workpiece table in the main scanning direction for the first scaning line based on the positional deviation amounts which have been detected;

calculate a second correction amount of the workpiece table in the main scanning direction for the second scanning line based on the positional deviation amounts which have been detected;

calculate a third correction amount of the workpiece table in the main scanning directiion for the third scanning line based on the postional deviation amounts which have been detected;

calculate a fouth correction amount of the workpiece table in the main scanning directiion for a fourth scanning line positioned between the first scanning line and the second scanning line by interpolating the first correction amount and the second correction amount;

calculate a fifth correction amount of the workpiece table in the main scanning directiion for a fifth scanning line positioned between the first scanning line and the third scanning line by interpolating the first correction amount and the third correction amount;

correct the relative positions of the workpiece table and the droplet ejecting head based on the first through fifth correction amounts which have been calculated, for subsequent drawing operations along the first through fifth scanning lines on a workpiece for a product;

performing the first drawing operation by moving, by the table mover, the workpiece table along the first scanning line from among the plurality of scanning lines which extend in the main scanning direction and are set side by side in the sub-scanning direction and ejecting the droplets from the droplet ejecting head toward corresponding targets of each of the plurality of landing regions so as to draw the pattern along the first scanning line in each of the first, second, and third landing regions, respectively, on the reference workpiece;

moving, by the table mover, the workpiece table in the sub-scanning direction after performing the first drawing operation;

performing the second drawing operation by moving, by the table mover, the workpiece table along the second scanning line from among the plurality of scanning lines, in a direction opposite to the main scanning direction and ejecting the droplets from the droplet ejecting head toward corresponding targets of each of the plurality of landing regions so as to draw the pattern along the second scanning line in each of the first, second, and third landing regions, respectively, on the reference workpiece, after moving the workpiece table in the sub-scanning direction;

moving, by the table mover, the workpiece table in the direction opposite to the sub-scanning direction, after performing the second drawing operation;

performing the third drawing operation by moving, by the table mover, the workpiece table along the third scanning line from among the plurality of scanning lines and ejecting the droplets from the droplet ejecting head toward corresponding targets of each of the plurality of landing regions so as to draw the pattern along the third scanning line in each of the first, second, and third landing regions, respectively, on the reference workpiece, after moving the workpiece table in the direction opposite to the sub-scanning direction;

capturing the image of the patterns formed on the reference workpiece using the camera after the droplets, ejected from the droplet ejecting head from the first drawing operation, the second drawing operation, and the third drawing operation which were directed toward each of the first, second, and third landing regions, have landed on the reference workpiece;

detecting positional deviation amounts between positions of each of the targets of the reference workpiece and actual landing positions of the droplets on the reference workpiece based on the image which has been captured;

calculating the first correction amount of the workpiece table in the main scanning direction for the first scanning line based on the positional deviation amounts which have been detected;

calculating the second correction amount of the workpiece table in the main scanning direction for the second scanning line based on the positional deviation amounts which have been detected;

calculating the third correction amount of the workpiece table in the main scanning direction for the third scanning line based on the positional deviation amounts which have been detected;

calculating the fourth correction amount of the workpiece table in the main scanning direction for a fourth scanning line positioned between the first scanning line and the second scanning line by interpolating the first correction amount and the second correction amount;

calculating the fifth correction amount of the workpiece table in the main scanning direction for a fifth scanning line positioned between the first scanning line and the third scanning line by interpolating the first correction amount and the third correction amount; and correcting the relative positions of the workpiece table and the droplet ejecting head based on the first through fifth correction amounts which have been calculated, for subsequent drawing operations along the first through fifth scanning lines the a workpiece for a product.

4. The droplet ejecting method of claim 3, further comprising:

calculating a positional correction amount of the workpiece table in a rotation direction and in the sub-scanning direction; and calculating a positional correction amount of the droplet ejecting head in the rotation direction and in the sub-scanning direction.

\* \* \* \* \*